(12) United States Patent
Hu et al.

(10) Patent No.: US 12,252,806 B2
(45) Date of Patent: Mar. 18, 2025

(54) SYSTEMS AND METHODS FOR A PREHEAT RING IN A SEMICONDUCTOR WAFER REACTOR

(71) Applicant: GlobalWafers Co., Ltd., Hsinchu (TW)

(72) Inventors: Chieh Hu, Chiayi (TW); Chun-Chin Tu, Zhubei (TW)

(73) Assignee: GlobalWafers Co., Ltd, Hsinchu (TW)

( * ) Notice: Subject to any disclaimer, the term of this patent is extended or adjusted under 35 U.S.C. 154(b) by 342 days.

(21) Appl. No.: 17/139,339

(22) Filed: Dec. 31, 2020

(65) Prior Publication Data

US 2022/0205134 A1 Jun. 30, 2022

(51) Int. Cl.
| | |
|---|---|
| C30B 25/14 | (2006.01) |
| C23C 16/455 | (2006.01) |
| C23C 16/458 | (2006.01) |
| C30B 25/10 | (2006.01) |
| C30B 25/12 | (2006.01) |

(52) U.S. Cl.
CPC ........ C30B 25/14 (2013.01); C23C 16/45591 (2013.01); C23C 16/4585 (2013.01); C30B 25/12 (2013.01); C23C 16/45563 (2013.01); C23C 16/4588 (2013.01); C30B 25/10 (2013.01)

(58) Field of Classification Search
CPC ....... C30B 25/08; C30B 25/10; C30B 25/105; C30B 25/12; C30B 25/14; C30B 25/16; C30B 25/165; H01L 21/67–68792; C23C 16/00–56; C23C 16/45591; C23C 16/4585; C23C 16/45563; C23C 16/4588; C23C 16/45504; H01J 37/32–3299
See application file for complete search history.

(56) References Cited

U.S. PATENT DOCUMENTS

| | | | |
|---|---|---|---|
| 5,053,247 A * | 10/1991 | Moore | C23C 16/44 118/724 |
| 8,926,753 B2 * | 1/2015 | Yamada | C23C 16/455 118/728 |
| 9,127,360 B2 * | 9/2015 | Ramachandran | C30B 25/14 |
| 9,401,271 B2 * | 7/2016 | Pitney | H01L 21/02104 |
| 10,072,354 B2 | 9/2018 | Okabe et al. | |
| 10,240,235 B2 | 3/2019 | Brenninger et al. | |

(Continued)

FOREIGN PATENT DOCUMENTS

| | | | | |
|---|---|---|---|---|
| JP | 2000331939 A | * | 11/2000 | ......... C23C 16/4557 |
| JP | 2018148222 A | | 9/2018 | |

(Continued)

*Primary Examiner* — Kurt Sweely
(74) *Attorney, Agent, or Firm* — Armstrong Teasdale LLP (57) ABSTRACT

A reaction apparatus includes an upper dome, a lower dome, an upper liner, a lower liner, and a preheat ring. The upper dome and the lower dome define a reaction chamber. The preheat ring is positioned within the reaction chamber for heating the process gas prior to contacting the semiconductor wafer. The preheating ring is attached to an inner circumference of the lower liner. The preheat ring includes an annular disk and an edge bar. The annular disk has an inner edge, an outer edge, a first side, and a second side opposite the first side. The inner edge and the outer edge define a radial distance therebetween. The edge bar positioned on the first side and extending from the outer edge toward the inner edge an edge bar radial thickness. The radial distance is greater than the edge bar radial thickness.

13 Claims, 8 Drawing Sheets

(56) References Cited

U.S. PATENT DOCUMENTS

| | | | |
|---|---|---|---|
| 2007/0107653 A1* | 5/2007 | Yamada | C23C 16/455 117/200 |
| 2007/0122323 A1* | 5/2007 | Yamada | C23C 16/45587 422/243 |
| 2010/0029066 A1* | 2/2010 | Miyashita | C30B 29/06 118/728 |
| 2011/0174212 A1* | 7/2011 | Ramachandran | C30B 25/14 118/728 |
| 2013/0058636 A1* | 3/2013 | Koelmel | H01L 21/67346 392/416 |
| 2015/0020734 A1* | 1/2015 | Ye | C23C 16/4585 118/715 |
| 2016/0273128 A1 | 9/2016 | Kang | |
| 2019/0093254 A1 | 3/2019 | Okabe et al. | |

FOREIGN PATENT DOCUMENTS

| | | |
|---|---|---|
| WO | 2018001720 A1 | 4/2018 |
| WO | 2018163975 A1 | 9/2018 |

\* cited by examiner

SYSTEMS AND METHODS FOR A PREHEAT RING IN A SEMICONDUCTOR WAFER REACTOR

FIELD

The field relates generally to apparatus and methods for wafer processing, and more particularly to apparatus and methods for semiconductor wafer chemical vapor deposition processes.

BACKGROUND

Epitaxial chemical vapor deposition (CVD) is a process for growing a thin layer of material on a semiconductor wafer so that the lattice structure is identical to that of the wafer. Epitaxial CVD is widely used in semiconductor wafer production to build up epitaxial layers such that devices can be fabricated directly on the epitaxial layer. The epitaxial deposition process begins by introducing a cleaning gas, such as hydrogen or a hydrogen and hydrogen chloride mixture, to a front surface of the wafer (i.e., a surface facing away from the susceptor) to pre-heat and clean the front surface of the wafer. The cleaning gas removes native oxide from the front surface, permitting the epitaxial silicon layer to grow continuously and evenly on the surface during a subsequent step of the deposition process. The epitaxial deposition process continues by introducing a vaporous silicon source gas, such as silane or a chlorinated silane, to the front surface of the wafer to deposit and grow an epitaxial layer of silicon on the front surface. A back surface opposite the front surface of the susceptor may be simultaneously subjected to hydrogen gas. The susceptor, which supports the semiconductor wafer in the deposition chamber during the epitaxial deposition, is rotated during the process to allow the epitaxial layer to grow evenly.

However, epitaxial CVD growth rates are generally not uniform across the surface of each wafer because of non-uniform flow rates within the reactor. A lack of uniformity causes degradation in the flatness of the wafer and may be a result of variability or local flowrate deviations within the deposition chamber during the epitaxial deposition. Accordingly, there exists a need for a practical, cost-effective apparatus to improve local flowrate deviations to improve uniformity of epitaxial CVD growth rates.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a reaction apparatus for contacting a process gas with a semiconductor wafer is provided. The reaction apparatus includes an upper dome, a lower dome, an upper liner, a lower liner, and a preheat ring. The lower dome attached to the upper dome. The upper dome and the lower dome define a reaction chamber. The lower liner is positioned below the upper liner. The upper liner and the lower liner define a process gas inlet for channeling the process gas into the reaction chamber. The preheat ring is positioned within the reaction chamber for heating the process gas prior to contacting the semiconductor wafer. The preheating ring is attached to an inner circumference of the lower liner. The preheat ring includes an annular disk and an edge bar. The annular disk has an inner edge, an outer edge, a first side, and a second side opposite the first side. The inner edge and the outer edge define a radial distance therebetween. The edge bar positioned on the first side and extending from the outer edge toward the inner edge an edge bar radial thickness. The radial distance is greater than the edge bar radial thickness.

In another aspect, a preheat ring positioned within a reaction apparatus for heating a process gas prior to contacting a semiconductor wafer during a wafering process is provided. The preheat ring includes an annular disk and an edge bar. The annular disk has an inner edge, an outer edge, a first side, and a second side opposite the first side. The inner edge and the outer edge define a radial distance therebetween. The edge bar is positioned on the first side and extends from the outer edge toward the inner edge an edge bar radial thickness. The radial distance is greater than the edge bar radial thickness.

In yet another aspect, a method of manufacturing a semiconductor wafer in a reaction apparatus is provided. The reaction apparatus includes an upper dome and a lower dome defining a reaction chamber and an upper liner and a lower liner defining a process gas inlet. The reaction apparatus further includes a preheat ring positioned within the reaction chamber for heating the process gas prior to contacting the semiconductor wafer. The preheating ring is attached to an inner circumference of the lower liner and includes an annular disk and an edge bar positioned on the annular disk. The method includes channeling a process gas into the reaction chamber through the process gas inlet. The method also includes heating the process gas with the preheat ring. The method further includes adjusting at least one of a velocity and a direction of the process gas with the edge bar. The method also includes depositing a layer on the semiconductor wafer with the process gas. The edge bar facilitates forming a uniform thickness of the layer on the semiconductor wafer.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
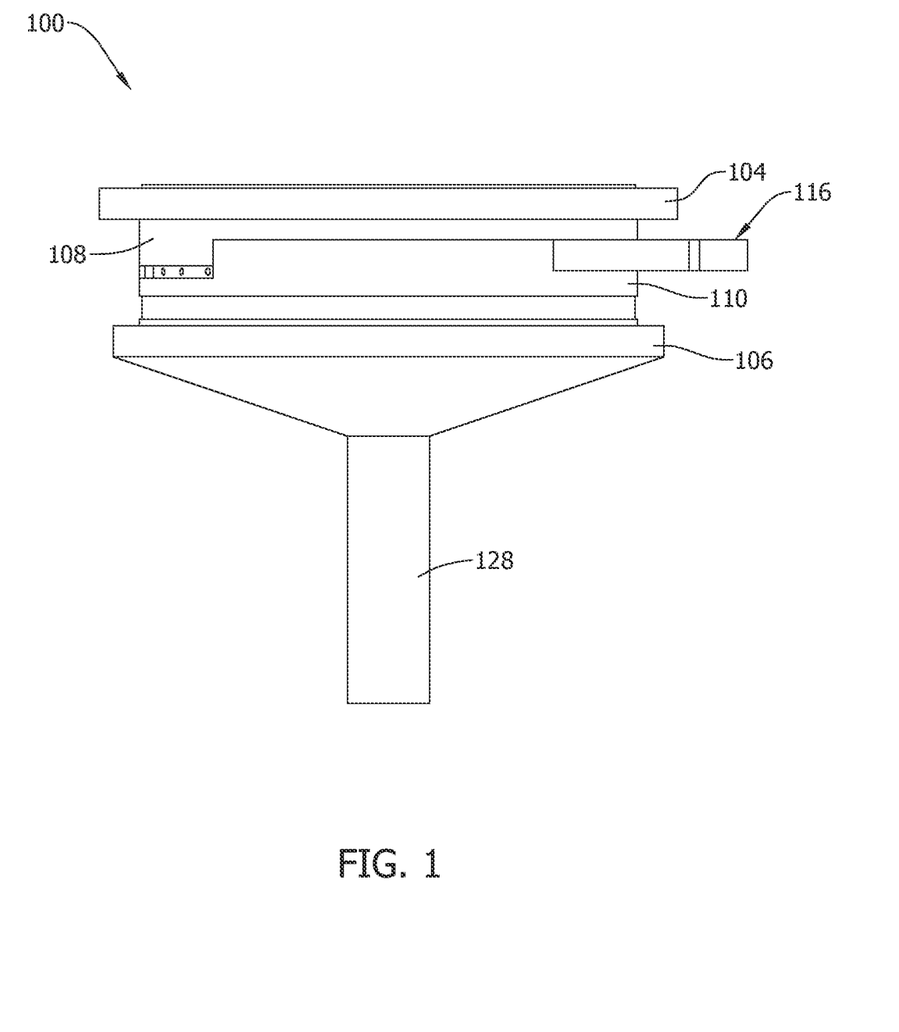
FIG. 1 is a front view of an apparatus for processing a substrate such as a semiconductor wafer.
Figure 2:
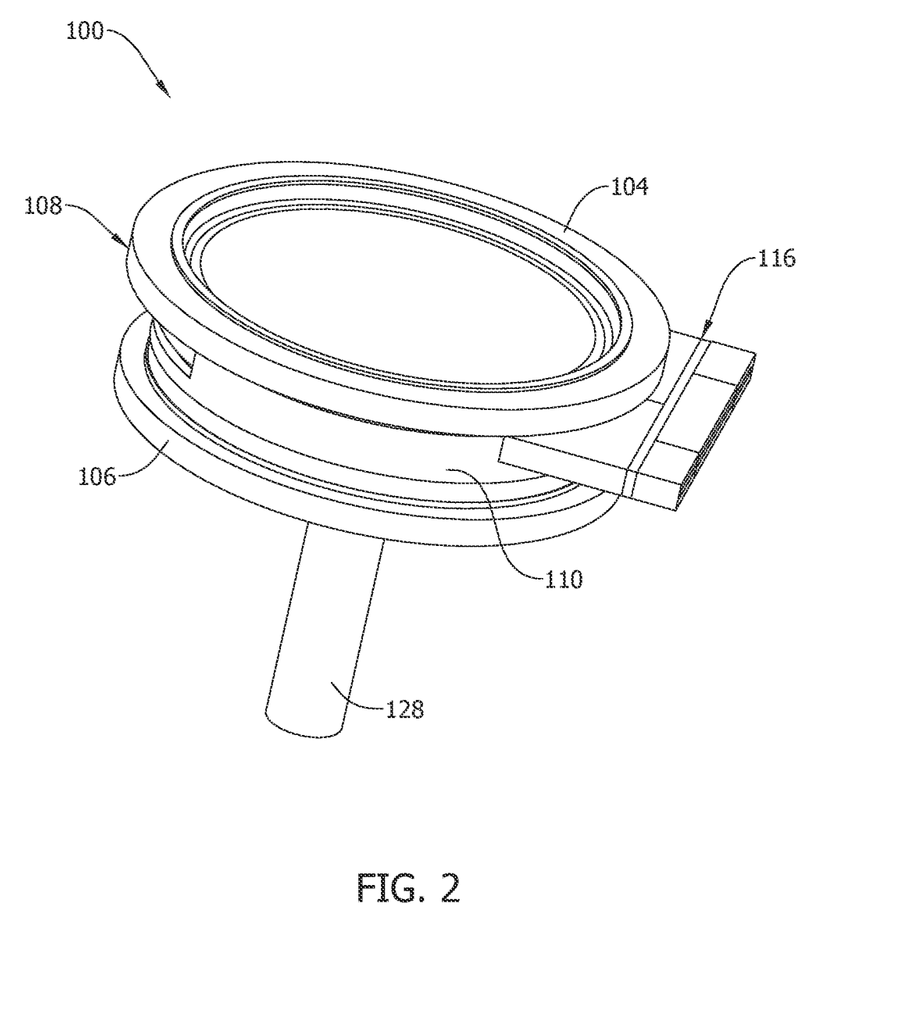
FIG. 2 is a perspective view of the apparatus shown in FIG. 1.

Referring now to FIG. 1, an apparatus for depositing an epitaxial layer on a semiconductor substrate in accordance with an embodiment of the present disclosure is generally referred to as 100. The illustrated apparatus is a single wafer reactor (i.e., a 300 mm AMAT Centura reactor); however, the apparatus and methods disclosed herein for providing a more uniform epitaxial layer are suitable for use in other reactor designs including, for example, multiple wafer reactors. The apparatus 100 includes a reaction chamber 102 comprising an upper dome 104, a lower dome 106, an upper liner 108, and a lower liner 110. Collectively, the upper dome 104, lower dome 106, upper liner 108, and lower liner 110 define an interior space 112 of the reaction chamber 102 in which process gas contacts a semiconductor wafer 114. A gas manifold 116 is used to direct process gas into the reaction chamber 102. A perspective view of the reaction chamber 102 and gas manifold 116 is shown in FIG. 2. In this embodiment, the apparatus 100 is a 300 mm AMAT Centura reactor. In alternative embodiments, the apparatus 100 may be any type of reactor.

The apparatus 100 may be used to process a wafer in a wafering process, including without limitation, depositing any type of material on a wafer performed by a chemical vapor deposition (CVD) process, such as epitaxial CVD or polycrystalline CVD. In this regard, reference herein to epitaxy and/or CVD processes should not be considered limiting as the apparatus 100 may also be used for other purposes such as to perform etching or smoothing processes on the wafer. Also, the wafer shown herein is generally circular in shape, though wafers of other shapes are contemplated within the scope of this disclosure.

Figure 3:
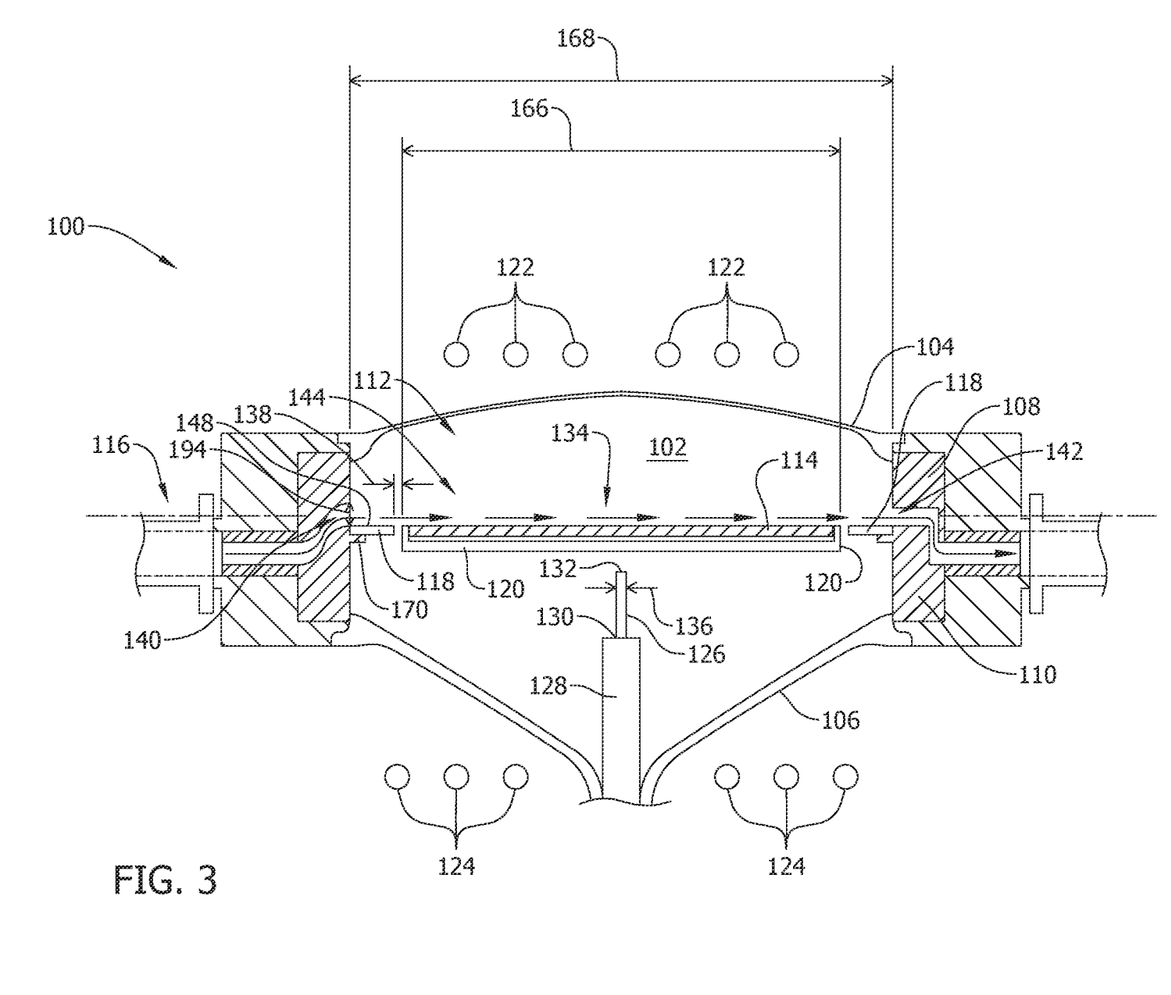
FIG. 3 is a cross sectional view of the apparatus shown in FIG. 1.

The apparatus 100 is shown in cross section to better illustrate the apparatus in FIG. 3. Within the interior space 112 of the reaction chamber 102 is a preheat ring 118 for heating the process gas prior to contact with a semiconductor wafer 114. The outside circumference of the preheat ring 118 is attached to the inner circumference of the lower liner 110. For example, the preheat ring 118 may be supported by an annular ledge 170 of the lower liner 110. A susceptor 120 (which may also be referred to herein as a "susceptor body") traversing the space interior to the preheat ring 118 supports the semiconductor wafer 114.

Process gas may be heated prior to contacting the semiconductor wafer 114. Both the preheat ring 118 and the susceptor 120 are generally opaque to absorb radiant heating light produced by high intensity lamps 122, 124 that may be located above and below the reaction chamber 102. Maintaining the preheat ring 118 and the susceptor 120 at a temperature above ambient allows the preheat ring 118 and the susceptor 120 to transfer heat to the process gas as the process gas passes over the preheat ring and the susceptor. Typically, the diameter of the semiconductor wafer 114 is less than the diameter of the susceptor 120 to allow the susceptor to heat the process gas before it contacts the wafer.

The preheat ring 118 and susceptor 120 may suitably be constructed of opaque graphite coated with silicon carbide, though other materials are contemplated. The upper dome 104 and lower dome 106 are typically made of a transparent material to allow radiant heating light to pass into the reaction chamber 102 and onto the preheat ring 118 and the susceptor 120. The upper dome 104 and lower dome 106 may be constructed of transparent quartz. Quartz is generally transparent to infrared and visible light and is chemically stable under the reaction conditions of the deposition reaction. Equipment other than high intensity lamps 122, 124 may be used to provide heat to the reaction chamber such as, for example, resistance heaters and inductive heaters. An infrared temperature sensor (not shown) such as a pyrometer may be mounted on the reaction chamber 102 to monitor the temperature of the susceptor 120, preheat ring 118, or semiconductor wafer 114 by receiving infrared radiation emitted by the susceptor, preheat ring, or wafer.

The apparatus 100 includes a shaft 126 that may support the susceptor 120. The shaft 126 extends through a central column 128. The shaft 126 includes a first end 130 attached to the central column 128 and a second end 132 positioned proximate a center region 134 of the semiconductor wafer 114. The shaft 126 has a shaft diameter 136 of about 5 millimeters (mm) to about 10 mm.

The shaft 126 is connected to a suitable rotation mechanism (not shown) for rotation of the shaft 126, susceptor 120, and semiconductor wafer 114 about a longitudinal axis X with respect to the apparatus 100. The outside edge of the susceptor 120 and inside edge of the preheat ring 118 (FIG. 3) are separated by a gap 138 to allow rotation of the susceptor. The semiconductor wafer 114 is rotated to prevent an excess of material from being deposited on the wafer leading edge and provide a more uniform epitaxial layer.

The preheat ring 118 modifies or tunes the process gas prior to contact with the semiconductor wafer 114 in order to improve the growth rate on the semiconductor wafer and create a more uniform radial deposition profile. The upper liner 108 and the lower liner 110 define a process gas inlet 140 and a process gas outlet 142. The process gas inlet 140 channels process gas into the reaction chamber 102, and the process gas outlet 142 channels process gas out of the reaction chamber. The process gas is channeled from the process gas inlet 140 to the process gas outlet 142 within the reaction chamber 102 as the semiconductor wafer 114 is rotated within the reaction chamber.

Figure 4:
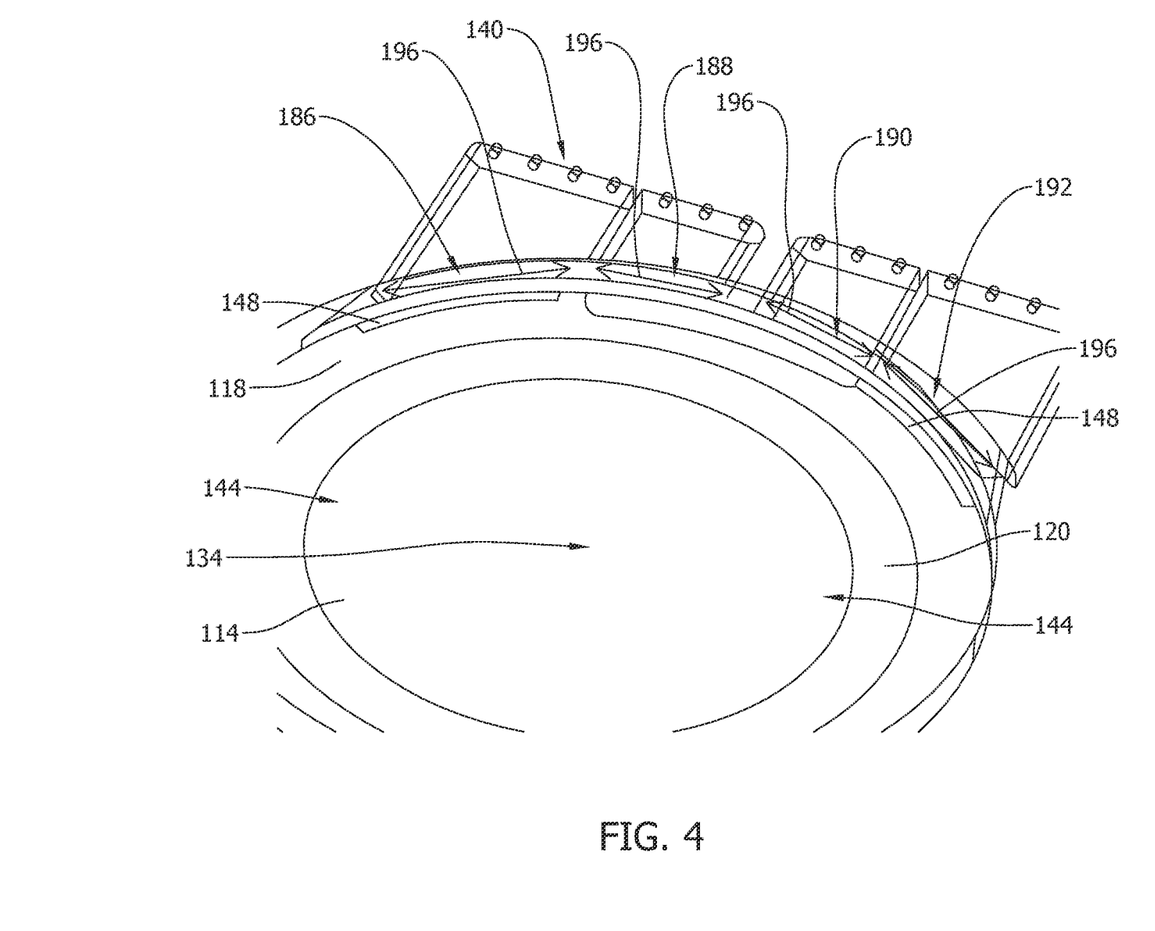
FIG. 4 is a perspective view of the apparatus shown in FIG. 1 with the upper dome and upper liner removed for clarity and portions of the apparatus shown as transparent for clarity.

The process gas inlet 140 may be separated into inlet segments 186, 188, 190, 192 each having a segment height 194 and a segment width 196. Each inlet segment 186, 188, 190, 192 channels process gas to a different portion of the semiconductor wafer 114. For example, as illustrated in FIG. 4, the upper liner 108 and the lower liner 110 define a first inlet segment 186 that channels process gas to an edge 144 of the semiconductor wafer 114, a second inlet segment 188 that channels process gas the center region 134 of the semiconductor wafer 114, a third inlet segment 190 that also channels process gas the center region 134 of the semiconductor wafer 114, and a fourth inlet segment 192 that also channels process gas to the edge 144 of the semiconductor wafer 114.

The growth rate of the semiconductor wafer 114 at an edge 144 of the semiconductor wafer is greater than the growth rate of the center region 134 of the semiconductor wafer. Increased growth rate at the edge 144 relative to the center region 134 may generate a non-uniform radial deposition profile and a non-uniform thickness of the semiconductor wafer 114. The preheat ring 118 described herein modifies or tunes the process gas prior to contact with the semiconductor wafer 114 in order to improve the growth rate on the semiconductor wafer, create a more uniform radial deposition profile, and manufacture semiconductor wafers with a uniform thickness.

Figure 5:
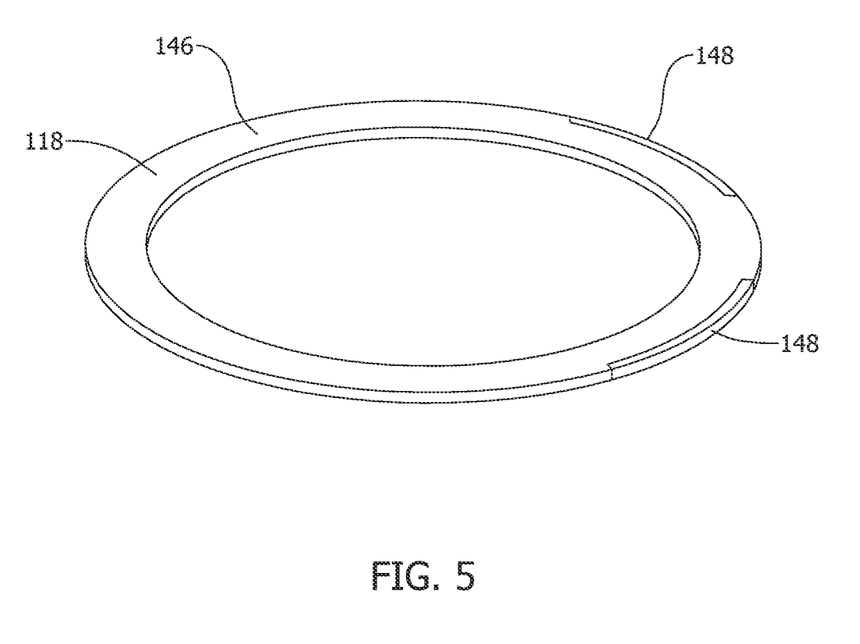
FIG. 5 is a perspective view of the preheat ring shown in FIGS. 3 and 4.
Figure 6:
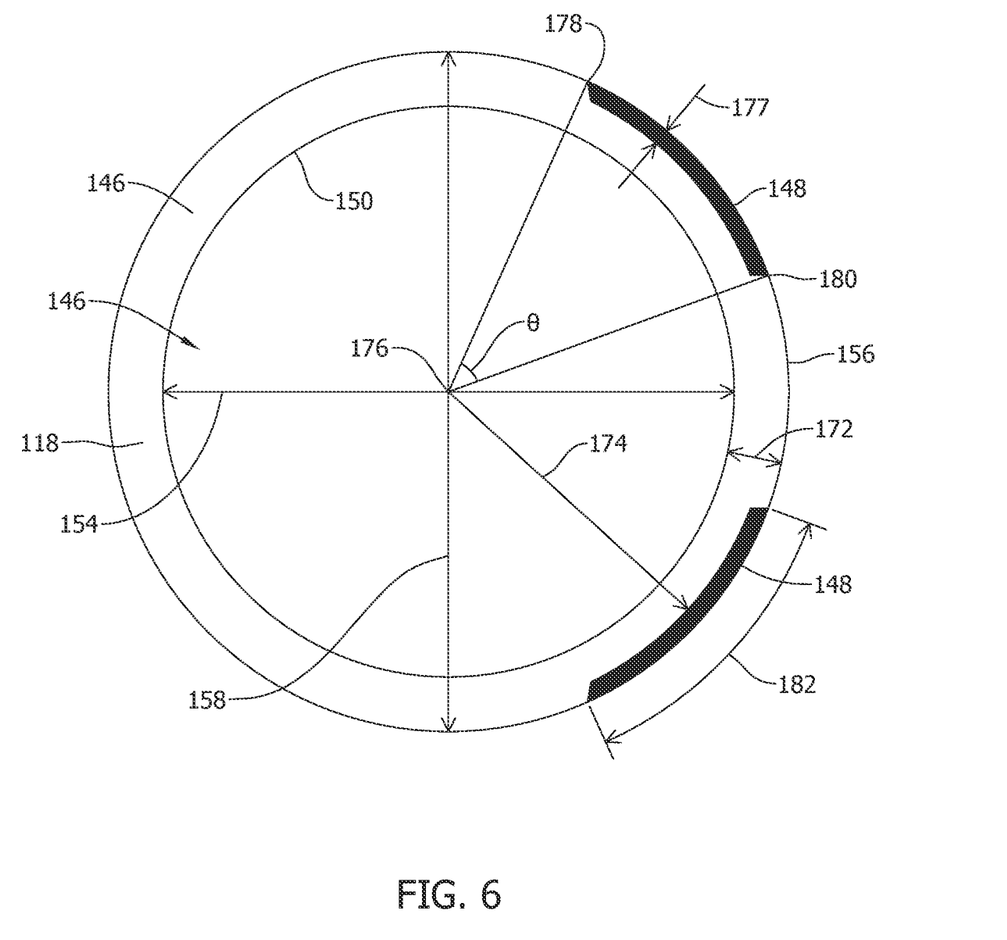
FIG. 6 is a top view of the preheat ring shown in FIG. 5.
Figure 7:
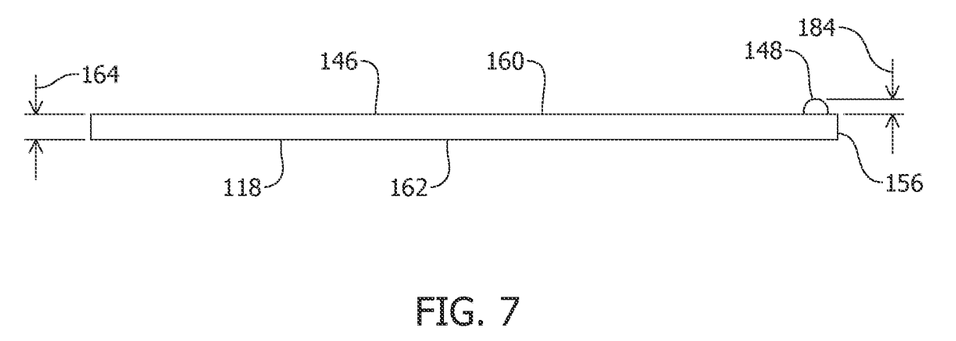
FIG. 7 is a side view of the preheat ring shown in FIG. 5.

The preheat ring 118 includes an annular disk 146 and an edge bar 148 attached to the annular disk. The annular disk 146 defines an inner edge 150 defining a disk hole 152 and an inner diameter 154, an outer edge 156 defining an outer diameter 158, a first side 160, a second side 162, and a disk thickness 164 between the first and second side. The inner diameter 154 is greater than a susceptor diameter 166 of the susceptor 120 such that the preheat ring 118 circumscribes the susceptor. Also, the preheat ring 118 shown herein is generally circular in shape to compliment the shape of the semiconductor wafer 114, though preheat rings of other shapes are contemplated within the scope of this disclosure to compliment wafers of other shapes.

The outer diameter 158 is smaller than a liner diameter 168 of the lower liner 110 such that the lower liner circumscribes the preheat ring 118 and the semiconductor wafer 114. The annular disk 146 extends from the inner edge 150 to the outer edge 156 a radial distance 172. The radial distance 172 is configured to enable the preheat ring 118 to absorb heat from the high intensity lamps 122 and 124 and transfer the absorbed heat to the process gas as the process gas passes over the preheat ring.

The edge bar 148 extends from the first side 160 of the annular disk 146 and modifies or tunes the process gas prior to contact with the semiconductor wafer 114 in order to improve the growth rate on the semiconductor wafer and create a more uniform radial deposition profile. Specifically, the edge bar 148 modifies, tunes, and/or changes at least one of a direction of flow of the process gas, a velocity of the process gas, and a flow rate of the process gas in order to improve the growth rate on the semiconductor wafer and create a more uniform radial deposition profile.

In the illustrated embodiment, the preheat ring 118 includes two edge bars 148. In alternative embodiments, the preheat ring 118 includes one edge bar 148. In yet another alternative embodiment, the preheat ring 118 may include multiple smaller edge bars 148. Accordingly, the preheat ring 118 may include at least one edge bar 148 and/or a plurality of edge bars 148 depending on the flow of process gas within the reaction chamber 102. More specifically, simulations and/or experimental results may be used to determine the number and position of edge bars 148 on the preheat ring 118 in order to improve the growth rate on the semiconductor wafer 114 and create a more uniform radial deposition profile. Similar to the preheat ring 118, the edge bars 148 is suitably made of opaque graphite coated with silicon carbide, though other materials are contemplated. In other embodiments, rather than being opaque, the edge bar 148 may be made of a translucent or transparent material.

Generally, the edge bar 148 is suitably positioned proximate the outer edge 156 of the annular disk 146, proximate the process gas inlet 140, and proximate specific regions of the semiconductor wafer 114 to correct and/or affect the growth rate of the semiconductor wafer 114 during processing, such as epitaxial deposition to alleviate non-uniformities. Specifically, the edge bar 148 is positioned proximate the process gas inlet 140 to cause the velocity or flow rate of the process gas at the edge 144 of the semiconductor wafer 114 to increase (relative to when an edge bar is not used) thereby decreasing the amount of material (e.g., silicon) that deposits at the edge of the semiconductor wafer during epitaxial CVD processes. Additionally, the position of the edge bar 148 proximate the process gas inlet may cause the direction of the process gas at the edge 144 of the semiconductor wafer 114 to change (relative to when an edge bar is not used) thereby decreasing the amount of material (e.g., silicon) that deposits in the edge of the semiconductor wafer during epitaxial CVD processes. Accordingly, the edge bar 148 is suitably positioned proximate the outer edge 156 of the annular disk 146 proximate the process gas inlet 140 to modify the process gas as it enters the reaction chamber 102. In alternative embodiments, the edge bar 148 may be positioned at any location on the preheat ring 118 that enables the edge bar 148 to operate as described herein.

Additionally, the edge bar 148 is positioned relative to the semiconductor wafer 114 to correct and/or affect the growth rate of non-uniformities of the semiconductor wafer 114 during processing. A simulation and/or experimentation may be used to determine where non-uniformities occur on the semiconductor wafer 114 when an edge bar is not used, and the edge bar 148 may be positioned on the preheat ring 118 to alleviate the non-uniformities. For example, the edge bar 148 may be positioned proximate the edge 144 of the semiconductor wafer 114 to cause the velocity or flow rate of the process gas at the edge to increase (relative to when an edge bar is not used) thereby decreasing the amount of material (e.g., silicon) that deposits at the edge of the semiconductor wafer during epitaxial CVD processes. Additionally, the edge bar 148 may be positioned proximate the edge 144 of the semiconductor wafer 114 to cause the direction of the process gas at the edge to change (relative to when an edge bar is not used) thereby decreasing the amount of material (e.g., silicon) that deposits in the edge of the semiconductor wafer during epitaxial CVD processes.

For example, the edge bars 148 of the illustrated embodiment are positioned immediately downstream of the first inlet segment 186 and the fourth inlet segment 192 to increase the velocity, increase the flow rate, and/or change the direction of the process gas directed toward the edge 144 of the semiconductor wafer 114. Accordingly, the edge bar 148 is suitably positioned proximate the edge 144 of the semiconductor wafer 114 in which a localized or global maximum layer thickness occurs to decrease the deposition at the edge and create a more uniform radial deposition profile. Note that this maximum layer thickness may be a local or global maximum, and may generally be referred to as a non-uniformity.

The thickness profile may be determined by use of any suitable method available to those of skill in the art including, for example, use of a Fourier-Transform Infrared (FTIR) spectrometer or use of a wafer flatness tool (e.g., KLA-Tencor Wafersight or WaferSight2; Milpitas, California). In some embodiments, the radial thickness profile of the substrate is determined before material deposition (e.g., before deposition of an epitaxial layer) and the thickness profile of the layered structure may then be measured. The thickness profile of the deposited layer may be determined by subtracting the substrate thickness from the layered structure thickness.

In the illustrated embodiment, each edge bar 148 is positioned on the preheat ring 118 such that each edge bar defines an edge bar radius 174, an edge bar angle θ relative to a center 176 of the semiconductor wafer 114, and an edge bar radial thickness 177. Specifically, the edge bar 148 has a first end 178 and a second end 180, and the edge bar angle θ is the angle defined between the center 176 of the semiconductor wafer 114, the first end, and the second end. The edge bar 148 also defines an edge bar circumferential length 182 between the first end 178 and the second end 180 and has an edge bar height 184 and an edge bar radial width 187. Additionally, the radial distance 172 is greater than the edge bar radial thickness 177.

In the illustrated embodiment, the edge bar 148 is a bump or rounded protrusion extending from the first side 160 of the preheat ring 118. In alternative embodiments, the edge bar 148 may have any shape that enables the edge bar to operate as described herein. Additionally, in the illustrated embodiment, the edge bar 148 is curved such that the edge bar forms an arc segment complimentary to the shape of the outer edge 156 of the preheat ring 118. In alternative embodiments, the edge bar 148 may have any shape that enables the edge bar to operate as described herein. In other embodiments, the edge bar 148 may be shaped to include various projections and/or notches or recesses. The edge bar 148 may also be beveled or rounded. Such non-uniform shapes may enable the edge bar 148 to correct and/or affect the growth rate of non-uniformities of the semiconductor wafer 114 during processing. For example, analysis of the thickness profile of the semiconductor wafer 114 may identify regions outside of the edges 144 that have decreased velocity or flow rate such that the deposition of material in those areas is non-uniform. The shape of the edge bar 148 may be adjusted to correct and/or affect the flow of process gas to those regions to decrease material deposition within those regions.

In the illustrated embodiment, the inner diameter 154 is about 240 mm to about 252 mm; the outer diameter 158 is about 296 mm to about 308 mm; the disk thickness 164 is about 4 mm to about 10 mm; the susceptor diameter 166 is about 240 mm to about 252 mm; the liner diameter 168 is about 296 mm to about 308 mm; the radial distance 172 is about 44 mm to about 68 mm; the edge bar radius 174 is about 143 mm to about 149 mm; the edge bar circumferential length 182 is about 20 mm to about 60 mm; the edge bar height 184 is about 0.5 mm to about 2 mm; the edge bar angle $\theta$ is about 20° to about 50°; the segment height 194 is about 5 mm to about 8 mm; and the segment width 196 is about 238 mm to about 248 mm. In alternative embodiments, the inner diameter 154, the outer diameter 158, the disk thickness 164, the susceptor diameter 166, the liner diameter 168, the radial distance 172, the edge bar radius 174, the edge bar circumferential length 182, the edge bar height 184, the edge bar angle $\theta$, the segment height 194, and the segment width 196 may be any distance or angle that enables the edge bar 148 to operate as described herein. More specifically, the inner diameter 154, the outer diameter 158, the disk thickness 164, the susceptor diameter 166, the liner diameter 168, the radial distance 172, the edge bar radius 174, the edge bar circumferential length 182, the edge bar height 184, the edge bar angle $\theta$, the segment height 194, and the segment width 196 are suitably chosen depending on a location and size of a local or global epitaxial layer thickness minimum or maximum. The ranges recited above for the inner diameter 154, the outer diameter 158, the disk thickness 164, the susceptor diameter 166, the liner diameter 168, the radial distance 172, the edge bar radius 174, the edge bar circumferential length 182, the edge bar height 184, the edge bar angle $\theta$, the segment height 194, the segment width 196, and the like are exemplary and values outside of the stated ranges may be used without limitation.

The edge bar height 184 may be configured to increase the velocity, increase the flow rate, and/or change the direction of the process gas directed toward the edge 144 of the semiconductor wafer 114. In the illustrated embodiment, the edge bar height 184 is about 0.5% to about 50% of the segment height 194. Increasing the edge bar height 184 relative to the segment height 194 generally results increased process gas velocity, flow rate, and/or a change in direction of the process gas which results in deposition of less material on the semiconductor wafer 114 in portions of the semiconductor wafer proximate the edge bar 148. Conversely, decreasing the edge bar height 184 relative to the segment height 194 generally results decreased process gas velocity, flow rate, and/or less change in direction of the process gas which results in deposition of more material on the semiconductor wafer 114 in portions of the semiconductor wafer proximate the edge bar 148. Therefore, the amount of material deposited on portions of the semiconductor wafer 114 proximate the edge bar 148 may be adjusted by varying the edge bar height 184.

The edge bar circumferential length 182 may also be configured to increase the velocity, increase the flow rate, and/or change the direction of the process gas directed toward the edge 144 of the semiconductor wafer 114. In the illustrated embodiment, the edge bar circumferential length 182 is about 5% to about 90% of the segment width 196. Increasing the edge bar circumferential length 182 relative to the segment width 196 generally results increased process gas velocity, flow rate, and/or a change in direction of the process gas which results in deposition of less material on the semiconductor wafer 114 in portions of the semiconductor wafer proximate the edge bar 148. Conversely, decreasing the edge bar circumferential length 182 relative to the segment width 196 generally results decreased process gas velocity, flow rate, and/or less change in direction of the process gas which results in deposition of more material on the semiconductor wafer 114 in portions of the semiconductor wafer proximate the edge bar 148. Therefore, the amount of material deposited on portions of the semiconductor wafer 114 proximate the edge bar 148 may be adjusted by varying the edge bar circumferential length 182.

Figure 8:
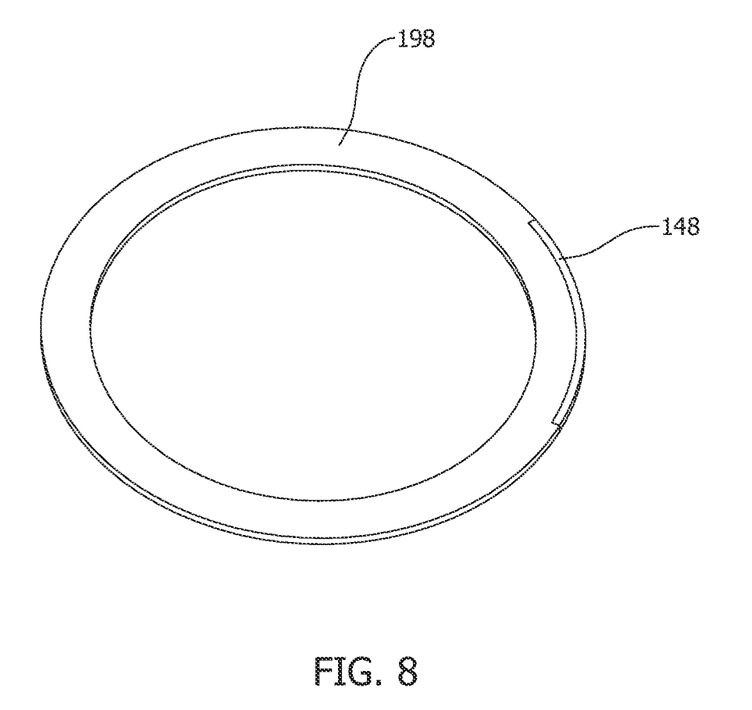
FIG. 8 is a perspective view of an alternative embodiment of the preheat ring shown in FIG. 5.

FIG. 8 is a perspective view of an alternative preheat ring 198 including a single edge bar 148 positioned immediately downstream of the second inlet segment 188 and the third inlet segment 190 to increase the velocity, increase the flow rate, or change the direction of the process gas directed toward the center region 134 of the semiconductor wafer 114. The edge bar 148 illustrated in FIG. 8 is substantially similar to the edge bars 148 illustrated in FIGS. 3-7 except the edge bar is positioned to address when a localized or global maximum layer thickness occurs in the center region 134 rather than the edge 144 of the semiconductor wafer 114. Accordingly, the preheat ring 198 includes the edge bar 148 that is suitably positioned immediately downstream of the second inlet segment 188 and the third inlet segment 190 to decrease the deposition at the center region and create a more uniform radial deposition profile.

Figure 9:
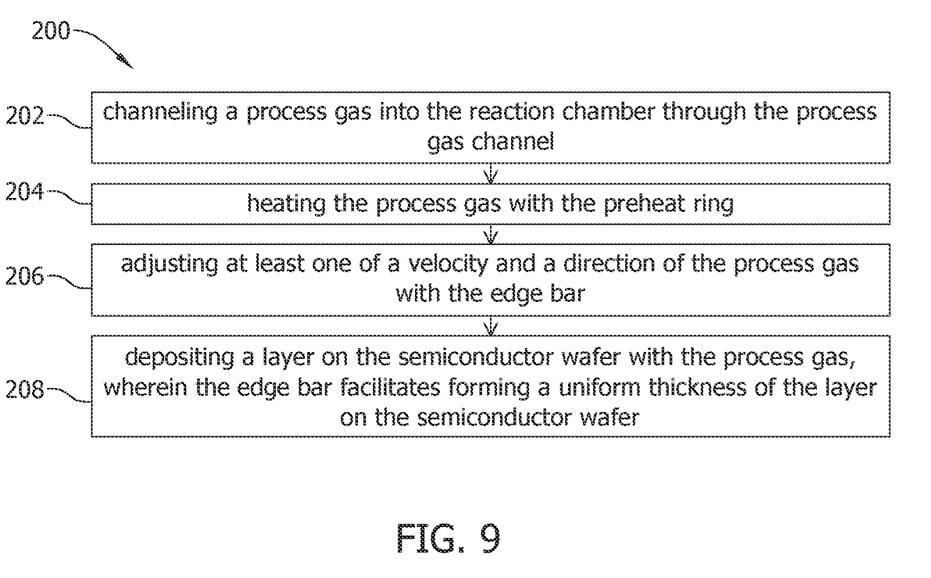
FIG. 9 is a flow diagram of a method of manufacturing a semiconductor wafer in the reaction apparatus shown in FIG. 1.

FIG. 9 is a flow diagram of a method 200 of manufacturing a semiconductor wafer in a reaction apparatus. The method 200 includes channeling 202 a process gas into the reaction chamber through the process gas inlet. The method 200 also includes heating 204 the semiconductor wafer with the preheat ring. The method 200 further includes adjusting 206 at least one of a velocity and a direction of the process gas with the edge bar. The method 200 also includes depositing 208 a layer on the semiconductor wafer with the process gas. The edge bar facilitates forming a uniform thickness of the layer on the semiconductor wafer.

EXAMPLES

The processes of the present disclosure are further illustrated by the following Example. This Example should not be viewed in a limiting sense.

Example 1: Determining the Effect of Using an Edge Bar on the Radial Growth Rate Profile of the Semiconductor Wafer A preheat ring including at two edge bars positioned in front of the first inlet segment and the fourth inlet segment as described herein was tested in a single wafer epitaxy reactor to determine its effect on the epitaxial wafer growth rate profile. The epitaxial wafers were prepared by exposing single crystal silicon wafers produced by the Czochralski method to a process gas at a wafer temperature between 1050° C. to 1150° C. The edge bar had an edge bar height of 0.5 mm.

Figure 10:
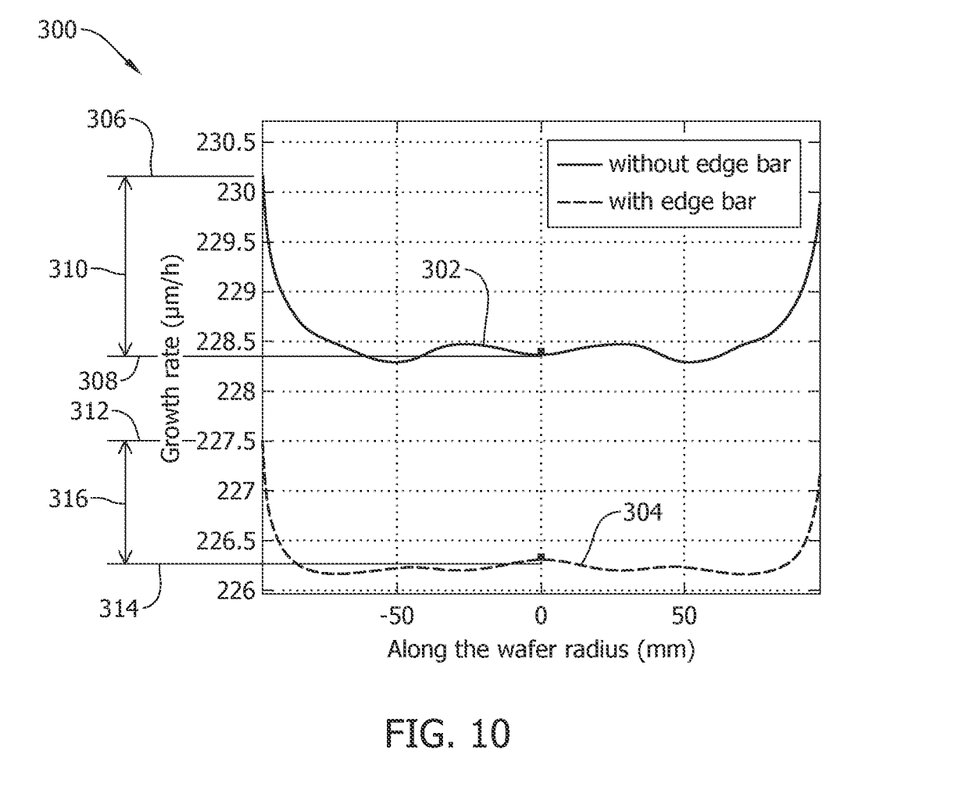
FIG. 10 is a graph of epitaxial wafer radial growth rate as a function of wafer radial distance in accordance with Example 1.

A control run was performed in which a preheat ring without an edge bar was used. FIG. 10 is a graph 300 of epitaxial wafer radial growth rate as a function of wafer radial distance. As can be seen from FIG. 10, the control resulted in a higher growth rate radial profile 302, and the edge bar resulted in a lower growth rate radial profile 304. The higher growth rate radial profile 302 has a first edge growth rate 306 and a first center region growth rate 308 and the difference between the first edge growth rate 306 and the first center region growth rate 308 is a first growth rate difference 310. Similarly, the lower growth rate radial profile 304 has a second edge growth rate 312 and a second center region growth rate 314 and the difference between the second edge growth rate 312 and the second center region growth rate 314 is a second growth rate difference 316. As shown in FIG. 10, the first growth rate difference 310 is greater than the second growth rate difference 316, and the lower growth rate radial profile 304 is more uniform because the difference between the edge growth rate and the center region growth rate of the lower growth rate radial profile 304 is smaller than the difference between the edge growth rate and the center region growth rate of the higher growth rate radial profile 302. Accordingly, the edge bars generated a uniform growth rate profile of the epitaxial wafer.

Compared to conventional methods for producing silicon wafers, the systems and methods of the present disclosure have several advantages. For example, reactors that include preheat rings including edge bars as described facilitate cost-effective manufacture of semiconductor wafers with a uniform growth rate profile during deposition. The uniform growth rate profile generates a more uniform deposition thickness profile. Thus, the edge bars enable production of a semiconductor wafer with a uniform thickness profile. An example preheat ring has edge bars near a process gas inlet to correct and/or affect the growth rate of non-uniformities of the semiconductor wafer during processing. The edge bars thereby increase the velocity, increase the flow rate, and/or change the direction of process gas to the edges of the semiconductor wafers, reducing the growth rate of the edges of the semiconductor wafer and manufacturing semiconductor wafers with a uniform thickness profile. Accordingly, the example preheat rings eliminate or reduce local growth rate deviations, as compared to the prior art, to improve the uniformity of epitaxial CVD growth on a wafer. Additionally, use of the above examples can improve the production rate of the epitaxial CVD system, and can lower operational costs by reducing waste.

When introducing elements of the present invention or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A reaction apparatus for contacting a process gas with a semiconductor wafer, the reaction apparatus comprising:
   an upper dome;
   a lower dome attached to the upper dome, the upper dome and the lower dome defining a reaction chamber;
   an upper liner;
   a lower liner positioned below the upper liner, the upper liner and the lower liner defining a process gas inlet for channeling the process gas into the reaction chamber, wherein the process gas inlet includes:
      a first inlet segment that directs the process gas to an edge of the semiconductor wafer;
      a second inlet segment that directs the process gas to a center region of the semiconductor wafer;
      a third inlet segment that directs the process gas to the center region of the semiconductor wafer; and
      a fourth inlet segment that directs the process gas to the edge of the semiconductor wafer; and
   a preheat ring positioned within the reaction chamber for heating the process gas prior to contacting the semiconductor wafer, the preheat ring attached to an inner circumference of the lower liner, the preheat ring comprising:
      an annular disk having an inner edge, an outer edge, a first side, and a second side opposite the first side, the inner edge and the outer edge defining a radial distance therebetween;
      a first edge bar positioned on the first side proximate the outer edge and downstream from the first inlet segment, the first edge bar extending radially from the outer edge toward the inner edge a first edge bar radial thickness, wherein the radial distance is greater than the first edge bar radial thickness, the first edge bar extending a circumferential length to form an arc segment and having a first edge bar height; and
      a second edge bar adjacent the first edge bar, wherein the second edge bar is positioned downstream from the fourth inlet segment, and wherein the first and second edge bars are spaced circumferentially from one another to allow the process gas to flow therebetween from the second and third inlet segments to the center region of the semiconductor wafer.

2. The reaction apparatus of claim 1, wherein the first edge bar adjusts a direction of the process gas directed from the first inlet segment to the edge of the semiconductor wafer.

3. The reaction apparatus of claim 1, wherein the first edge bar extends the circumferential length of between 20 mm to 60 mm and has the first edge bar height of between 0.5 mm to 2 mm.

4. The reaction apparatus of claim 1, wherein an arc measure of the arc segment formed by the first edge bar is between 20° to 50°.

5. The reaction apparatus of claim 1, wherein the first inlet segment has a segment width and a segment height, and wherein the first edge bar extends the circumferential length that is between 5% to 90% of the segment width and has the first edge bar height that is between 0.5% to 50% of the segment height.

6. The reaction apparatus of claim 1, wherein the second inlet segment and the third inlet segment are disposed between the first inlet segment and the fourth inlet segment.

7. The reaction apparatus of claim 6, wherein:

the second inlet segment is adjacent to the first inlet segment and the third inlet segment; and the third inlet segment is adjacent the second inlet segment and the fourth inlet segment.

8. The reaction apparatus of claim 6, wherein the first inlet segment, second inlet segment, third inlet segment, and fourth inlet segment are the only inlet segments of the reaction apparatus.

9. The reaction apparatus of claim 6, wherein the process gas inlet is the only process gas inlet of the reaction apparatus.

10. The reaction apparatus of claim 1, wherein:

the second inlet segment is adjacent to the first inlet segment and the third inlet segment; and the third inlet segment is adjacent the second inlet segment and the fourth inlet segment.

11. The reaction apparatus of claim 1, wherein the first inlet segment, second inlet segment, third inlet segment, and fourth inlet segment are the only inlet segments of the reaction apparatus.

12. The reaction apparatus of claim 1, wherein the process gas inlet is the only process gas inlet of the reaction apparatus.

13. The reaction apparatus of claim 1, wherein the second inlet segment is free of an edge bar downstream from the second inlet segment and the third inlet segment is free of an edge bar downstream from the third inlet segment and the third inlet segment.

* * * * *